United States Patent
Nagayama et al.

(10) Patent No.: US 6,624,567 B2
(45) Date of Patent: Sep. 23, 2003

(54) ORGANIC ELECTROLUMINESCENT DISPLAY PANEL AND ITS MANUFACTURING METHOD

(75) Inventors: Kenichi Nagayama, Yonezawa (JP); Kunihiko Shirahata, Yonezawa (JP); Takayuki Kitajima, Yonezawa (JP)

(73) Assignee: Tohoku Pioneer Corporation (JP)

( * ) Notice: Subject to any disclaimer, the term of this patent is extended or adjusted under 35 U.S.C. 154(b) by 47 days.

(21) Appl. No.: 09/876,640

(22) Filed: Jun. 7, 2001

(65) Prior Publication Data

US 2002/0008467 A1 Jan. 24, 2002

(30) Foreign Application Priority Data

Jun. 8, 2000 (JP) ........................................ 2000-171945

(51) Int. Cl.[7] .............................................. H05B 33/00
(52) U.S. Cl. ...................... 313/503; 313/505; 313/506; 428/917
(58) Field of Search ................................ 313/503, 500, 313/504, 505, 506, 509; 315/169.3; 428/690, 917; 345/45, 55, 76

(56) References Cited

U.S. PATENT DOCUMENTS

| 4,670,690 A | * | 6/1987 | Ketchpel | 313/505 |
| 5,773,931 A | * | 6/1998 | Shi et al. | 313/509 |
| 6,351,066 B1 | * | 2/2002 | Gyoutoku et al. | 313/504 |

FOREIGN PATENT DOCUMENTS

| JP | 2911552 | 2/1992 |
| JP | 8315981 | 11/1996 |

* cited by examiner

Primary Examiner—Ashok Patel
(74) Attorney, Agent, or Firm—Webb Ziesenheim Logsdon Orkin & Hanson P.C.

(57) ABSTRACT

A new organic EL display panel includes transparent electrodes 2, an insulating layer 7, an organic luminous layer 4 and backside electrodes 5 successively laid on a transparent substrate 1. The insulating layer 7 is converted from a positive novolac, negative cyclized rubber or chemical amplified photoresist layer shaped to a grate pattern, by baking treatment to remove water and a solvent from the photoresist layer. Electric resistance of the insulating layer 7 is good enough to inhibit leakage of an electric current between the electrodes 2 and 5. The EL display panel reproduces a distinct image over a long term without growth of dark spots.

3 Claims, 1 Drawing Sheet

ORGANIC ELECTROLUMINESCENT DISPLAY PANEL AND ITS MANUFACTURING METHOD

BACKGROUND OF THE INVENTION

The present invention relates to a display panel having an organic layer which emits light in response to impression of electricity, and also relates to its manufacturing method.

Liquid crystal display panels have been used as a color image display device in various fields instead of a cathode ray tube. Such an image gained by the liquid crystal panel is hardly distinguished in accordance with a visual angle or lightness of the circumference, since the image is reproduced by light which passes through a liquid crystal layer from a back light source.

On the other hand, an electroluminescent (EL) display panel reproduces an image by planar emission, so that the image is distinguished with sufficient resolution even in a dark place without affection of a visible angle.

Various inorganic and organic compounds have been proposed so far for EL material. Especially, organic compounds are expected as an EL layer which can reproduces a bright image with saved power consumption. A display panel involving an organic EL layer has the structure as shown in FIG. 1, wherein striped transparent electrodes (anode) 2, a hole-transporting layer 3, an organic luminous layer 4 and striped backside electrodes (cathode) 5, which extends along a direction crossing the transparent electrodes with a right angle so as to make up X-Y matrix, are successively laminated on a transparent substrate 1. A protective layer 6 is further formed on the backside electrodes 5.

When a drive current is supplied to a predetermined position on X-Y matrix, a hole from the anode 2 recombines with an electron from the cathode 5 in the organic luminous layer 4. An organic luminous molecule in the layer 4 emits light due to excitation by the recombination. The resultant planar emission is observed through the transparent electrodes 2 and the transparent substrate 1.

Leakage of an electric current is intercepted by an insulating layer 7 with a grate pattern interposed between the transparent electrodes 2 and the backside electrodes 5, so as to inhibit unfavorable light emission (so-called "cross-talk") at a part other than the predetermined position of X-Y matrix or at a part near the predetermined position, as shown in FIG. 2. For instance, Jap. Pat. No. 2911552 discloses formation of an insulating layer 7, which opens at a crossing point of the transparent electrodes 2 with the backside electrodes 5 but has an opening space smaller than the crossing area.

Since an organic EL substance is easily decomposed or denatured by humidity or a solvent, an insulating layer 7 is made of material which is free from water or a solvent or scarcely contains water or a solvent. In this regard, a stable polymer such as polyimide or an inorganic substance such as metal oxide is necessarily used without free choice of material for the insulating layer. However, use of an expensive polymer such as polyimide causes price increase of an organic EL display device. Formation of an insulating layer 7 from an inorganic substance requires a dry etching step for patterning, so that a manufacturing process is complicated and resulted in increase of a manufacturing cost.

SUMMARY OF THE INVENTION

The present invention aims at provision of a new organic EL display panel with high resolution at a low cost. An object of the present invention is to form an insulating layer from a cheap photoresist without complication of a manufacturing process.

The organic EL display panel proposed by the present invention comprises transparent electrodes, an insulating layer shaped to a grate pattern, an organic luminous layer deposited on the transparent electrodes through apertures of by the insulating layer and backside electrodes successively laid on a transparent substrate. The insulating layer is made of a baked photoresist.

The organic luminous layer may be a monolayer or multilayer including an organic luminous substance, or a bilayer of a hole-transporting layer 3 and an organic luminous layer 4, as shown in FIGS. 1 and 2.

A photoresist for an insulating layer is selected from positive novolac, negative cyclized rubber and chemical amplified photoresists. Black pigment or dye may be added to the photoresist. A cathode separator may be laid on the insulating layer made of the photoresist.

The new organic EL display panel is manufactured as follows: A positive novolac, negative cyclized rubber or chemical amplified photoresist is applied onto a transparent substrate, on which transparent electrodes are pre-formed in a striped shape. The applied photoresist is shaped to a grate pattern and then baked to remove a solvent and moisture therefrom. Thereafter, an organic luminous monolayer or multilayer containing an organic luminous substance and backside electrodes are successively laid on the insulating layer. In case of formation of a cathode separator, the cathode separator is laid on the insulating layer which has been converted from the photoresist by pre-baking.

Figure 1:
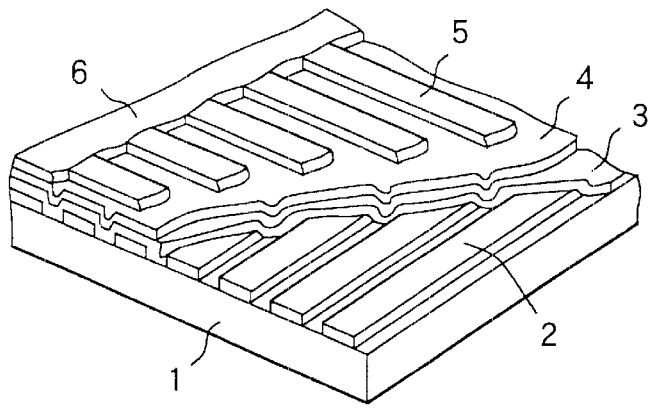
FIG. 1 is a view for explaining a laminated structure of an organic EL display panel.
Figure 2:
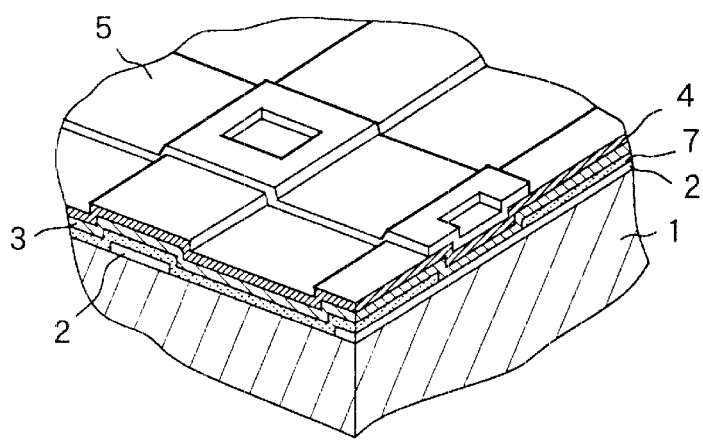
FIG. 2 is a view illustrating an organic EL display panel having an insulting layer.

An organic EL display panel proposed by the present invention is manufactured by the following steps:

[Formation of Transparent Electrodes]

A transparent substrate 1 such as a glass or synthetic film is covered with a mask having openings with a predetermined pattern. An electro-conductive substance such as ITO is deposited on the transparent substrate 1 by sputtering or ion-plating, so to form transparent electrodes 2. The transparent layer of about 0.2 μm in thickness is shaped to a striped pattern extending along X-X direction with width of 0.3 mm and pitch of 0.28 mm.

[Formation of an Insulating layer]

After formation of the transparent electrodes 2, a photoresist is applied onto the transparent substrate 1 by a spin coater or the like. Such a photoresist as a positive novolac, negative cyclized rubber or chemical amplified resin, which has been commonly used in a conventional photolithography process, is useful for formation of an insulating layer 7. The insulating layer 7 is blackened by addition of black pigment or dye to the photoresist, in order to enhance contrast of a display panel.

A positive novolac photoresist is composed of phenol-formaldehyde resin (novolac resin) mixed with a photosensitizer such as diazo naphthoquinone. Diazo naphthoquinone may be diazo naphthoquinone ester of polyhydroxybenzophenone with novolac resin, diazo naphthoquinone having a skeleton of 3,3,3',3'-tetramethyl-1,1'-spiro indane-5,6,7,5', 6',7'-hexyol or diazo naphthoquinone having a skeleton of phenolphthalein.

A novolac photoresist layer is exposed and then developed in an alkali aqueous solution, since exposed parts are converted to alkali-soluble, while non-exposed parts are still unsoluble to alkali. A preferable novolac resin is a tandem type comprising a low-molecular component (150~500) mixed with a high-molecular component (>500), so as to form a photoresist layer well-balanced in sensitivity, resolution and heat-resistance.

A negative photosensitive cyclized rubber photoresist may be prepared by mixing aromatic bisazide as a photosensitizer in cyclized rubber which incorporates a ring structure in its macromolecule by treatment of natural or synthetic rubber with stannic tetrachloride or the like. Representative aromatic bisazide is 2,6-di(4'-azide benzal)-4-methycyclohexanone. When the negative photosensitive cyclized rubber photoresist is exposed, cross-linking reactions occurs at an exposed part to form an insoluble network structure. The negative photoresist pattern is formed in this way.

A chemical amplified photoresist is a two-component type composed of a polymer having a functional group reactive to an acid catalyst and an acid-generating agent, or a three-component type composed of a base polymer, a substance having a functional group reactive to an acid catalyst and an acid-generating agent.

Such the polymer having a functional group reactive to an acid catalyst may be selected from a copolymer of hydroxystyrene with a methacrylate ester having an epoxy group, polymers which produces benzyl cation derivatives by electrophilic substitution reaction, polyphthalaldehyde, polyphthalaldehyde which introduces silicon in its molecule and polymers including polycarbonate, polyformal or alcoxy pyrimidine derivatives.

An acid-generating agent may be an ionic type such as onium, diazonium, triarylsulfonium or diaryliodonium salts, a nonionic type such as halogenated phenols, tris (trihalogenated methyl)-s-triazine derivatives or halogenated phenol derivatives, or an acid ester type such as a sulfonate ester of 2-nitrobenzyl alcohol, 2-nitrobenzyl sulfonate, 9,10-ethoxy anthracene -2-sulfonate or a sulfonate ester of phenol derivatives.

A substance having a functional groups reactive to an acid catalyst may be diphenyl silane diol or carbinol. A representative base polymer for the three-component type is polyhydroxystyrene.

A cross-linking agent such as hexamethylol melamine or epoxy compounds, or a dissolution inhibitor having a skeleton of bisphenol phthalein A or cresol phthalein may be optionally added to the chemical amplified photoresist.

When the chemical amplified photoresist layer is exposed, an acid is generated by photochemical reaction. The acid reacts with a reactive functional group or substance of the polymer in the following PEB (post-exposure baking) step. Change of physical property caused by the reaction is used for patterning the resin layer.

Figure 3A:
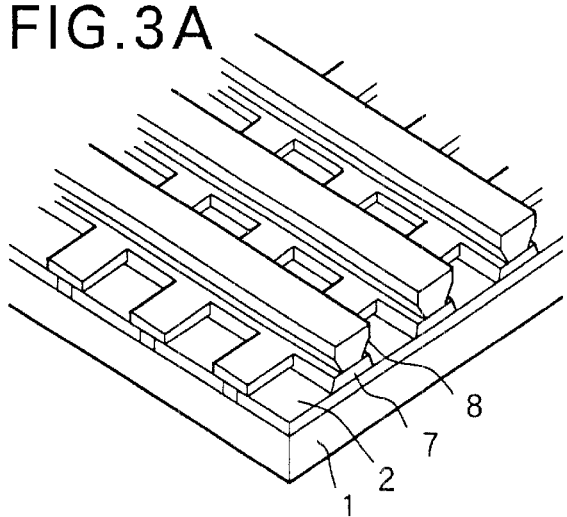
FIG. 3A is a view illustrating an organic EL display panel of the present invention before formation of an organic luminous layer and backside electrodes.
Figure 3B:
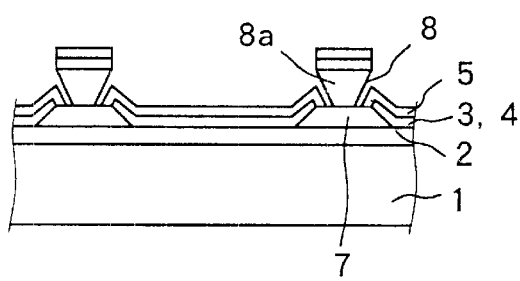
FIG. 3B is a view illustrating the same organic EL display panel after formation of an organic luminous layer and backside electrodes.

In case of any photoresist, unnecessary parts are removed away from the exposed photoresist layer, and the remaining photoresist layer is shaped to a predetermined pattern and baked to an insulating layer 7, as shown in FIGS. 3A and 3B.
[Formation of a Cathode Partition]

After formation of a patterned photoresist layer, an insulating cathode separator 8 is optionally laid on the insulating layer 7, as shown in FIGS. 3A and 3B. Formation of such the cathode separator 8 is disclosed in JP 8-315981A, for instance. That is, a negative photoresist is applied to thickness of 3 μm or so on the transparent electrodes 2 by a spin coater, and then a photoresist layer is shaped to a predetermined profile so as to form the cathode separator 8 having an over-hanging part 8a. Due to the cathode separator 8, backside electrodes 5 can be precisely patterned. Of course, the cathode separator 8 can be omitted.

When the cathode separator 8 is formed, the insulating layer 7 would be unfavorably damaged by a solvent for cathode separator material or a developer for patterning the cathode separator 8. Such damage can be suppressed by insertion of a pre-baking step in prior to formation of the cathode separator 8 to improve chemical resistance of the insulating layer 7. For instance, a positive novolac photoresist, which is pre-baked at a temperature higher than 150° C. or so, well endures against a solvent PGMEA (NMP, ethyl lactate) and a developer TMAH (butyl acetate, NaOH, KOH).
[Baking Step]

After the photoresist layer and optionally the cathode separator 8 are patterned, the photoresist layer is baked by a heat source such as a hot plate, a warm wind-circulating oven or an infrared ray heater. Since baking is finished in a shorter time period at a higher temperature, a baking temperature is determined at a value above a boiling temperature of water or a solvent, e.g. above 100° C. (preferably above 150° C., most preferably above 200° C.). Although an upper limit of the baking temperature depends on a kind of base resin of the photoresist, it is generally determined within a range of 300–400° C.

An atmosphere for baking the photoresist may be either one of open air, inert gas such as nitrogen or argon or vacuum, but humidity is preferably held at a lowest possible level. Some kinds of photoresist layers often change their physical property or shape due to progress of cross-linking reaction caused by baking, but such change does not bring out any problems as far as insulation of the photoresist layer is ensured. For instance, cross-linking reaction of novolac resin useful as a positive photoresist begins at a temperature near 150° C.

Since water and a solvent are removed from the photoresist layer by baking, the photoresist layer is converted to an insulating layer 7 with excellent resistivity. For comparison, a conventional photoresist layer, which is not baked, includes residual water or solvent, so that an organic luminous layer is denatured due to the residual water or solvent, resulting in occurrence of faults such as dark spots.

After the baking step, the insulating layer 7 is preferably prevented from re-absorption of water in the photoresist, by lamination of an organic luminous layer 4 at the earliest possible time. Re-absorption of water is also inhibited by holding the transparent substrate 1 having the insulating layer 7 formed thereon in a dry nitrogen or vacuum atmosphere, during a time period from the baking step until deposition of the organic luminous layer 4.
[Deposition of Organic Luminous Layer]

After the insulating layer 7 is shaped to a grate pattern, hole-transporting material is deposited on the transparent electrodes 2 through each aperture of the insulating layer 7 to form a hole-transporting layer 3 according to a conventional method. Thereafter, an organic luminous layer 4, which emits light with predetermined color tone, is formed as explained in the following paragraph. The organic luminous layer 4 may be laminated in a monolayered or multi-layered state containing an organic luminous substance therein, instead.

A mask (not shown) having openings with a predetermined pattern is located above the transparent substrate 1, so as to adjust each opening to a predetermined aperture of the patterned insulating layer 7 on the transparent substrate 1. An organic luminous compound corresponding to a first color (e.g. red) is vapor deposited. The opening of the mask is then shifted to another aperture adjacent to the first aperture, and an organic luminous compound corresponding to a second color (e.g. green) is vapor deposited. The opening of the mask is further shifted to another aperture adjacent to the second aperture, and an organic luminous compound corresponding to a third color (e.g. blue) is vapor deposited. The organic luminous layer 4 formed in this way can reproduce a full-color image. A display panel capable of reproducing a full-color image is also fabricated by combination of an organic luminous layers 4 (monolayer), which emits white light, with the RGB filter. Of course, one organic luminous compound may be deposited, to offer a monochromatic display panel.

[Formation of Backside Electrodes]

After deposition of the organic luminous layer 4, the mask is separated from the transparent substrate 1, and metal vapor is deposited on each organic luminous layer 4. The deposited metal layer is shaped to striped backside electrodes 5 extending along Y-Y direction crossing the transparent electrodes 2 with a right angle. Material for the backside electrodes 5 may be Al, Cu or Cu with low resistivity. In the case where there is the cathode separator 8 having an over-hanging part 8a, such the cathode separator 8 restrict flow of metal vapor, so that the striped electrodes 5 are precisely formed with high dimensional accuracy in a state each electrically insulated from adjacent ones.

[A Sealing Step]

After formation of the backside electrodes 5, the organic EL display panel is sealed with a protective layer 6 in order to inhibit its contact with the air. Sealing is performed in such a process as covering the EL display panel with glass sheets and then sealing its circumference with epoxy resin, CVD process for formation a stable macromolecular layer around the EL display panel, vapor deposition of an insulating inorganic layer such as oxides, or sealing the EL display panel in a metallic capsule. In any case, a moisture absorbent or a moisture-absorbing sheet is preferably enclosed together with the organic EL display panel, in order to hold the EL display panel in a dry atmosphere.

EXAMPLE 1

Three glass sheets were provided as a transparent substrate 1. An ITO layer of 1700 Å in thickness was deposited on each glass sheet, and shaped to striped transparent electrodes 2. Thereafter, a positive novolac photoresist (offered as OFPR-800LB by TOKYO OHKA KOGYO Co., Ltd.) was applied to thickness of 2 μm on the transparent substrate 1 by a spin coater, pre-baked, exposed and developed to form an insulating layer 7 with a grate pattern.

Three transparent substrates 1 each having the insulating layer 7 formed thereon were heated 10 minutes at 200° C., 250° C. and 300° C., respectively, on a hot plate, cooled on a cooling plate, and then immediately put in a vacuum chamber. It took about 10 minutes from finish of heating until putting in the vacuum chamber.

In the vacuum chamber, an organic luminous layer 4 of TPD/Alq$_3$ was deposited on each transparent substrate 1, and then backside electrodes 5 in a striped state extending along a direction crossing the transparent electrodes 2 with a right angle were formed thereon by vapor deposition of an Al layer using a mask. Thereafter, each EL display panel obtained in this way was sealed between glass sheets with epoxy resin. The EL display panel had pixels of the 256×64 dots which emitted green light.

Each EL display panel was examined by a heat-resistance test, whereby it was held 500 hours at 85° C. Test results proved that any EL display panel was stable without growth of dark spots from an edge of the insulating layer 7.

EXAMPLE 2

Three glass sheets were provided as a transparent substrate 1. An ITO layer of 1700 Å in thickness was laid on each substrate 1 and shaped to striped transparent electrodes 2. Thereafter, a positive novolac photoresist (offered as TFR-970 by TOKYO OHKA KOGYO Co., Ltd.) was applied to thickness of 1 μm on the transparent substrate 1 by a spin coater, pre-baked, exposed and developed to form an insulating layer 7 with a grate pattern.

Three transparent substrates 1 each having the insulating layer 7 formed thereon were heated 30 minutes at 200° C., 250° C. and 300° C., respectively, in a clean oven, cooled on a cooling plate, and then immediately put in a chamber filled with dry nitrogen. After the substrate 1 was sufficiently cooled, it was quickly transferred to a vacuum chamber.

In the vacuum chamber, an organic luminous layer 4 of TPD/Alq$_3$ was deposited on each transparent substrate 1, and then backside electrodes 5 in a striped state extending along a direction crossing the transparent electrodes 2 with a right angle were formed thereon by vapor deposition of an Al layer using a mask. Thereafter, each EL display panel obtained was sealed between glass sheets with epoxy resin. The display panel had pixels of the 256×64 dots which emitted green light.

Each display panel was examined by the same test as Example 1. Test results proved that any EL display panel was stable without growth of dark spots from an edge of the insulating layer 7.

EXAMPLE 3

Three glass sheets were provided as a transparent substrate 1. An ITO layer of 1700 Å in thickness was laid on each substrate 1 and shaped to striped transparent electrodes 2. Thereafter, a positive novolac photoresist (offered as TFR-970 by TOKYO OHKA KOGYO Co., Ltd.) was applied to thickness of 1 μm on the transparent substrate 1 by a spin coater, pre-baked, exposed and developed to form an insulating layer 7 with a grate pattern.

Each transparent substrates 1 having the insulating layer 7 formed thereon was heated 30 minutes at 200° C. in a clean oven, cooled on a cooling plate, and then a photoresist (offered as ZPN-1100 by Nippon Zeon Co., Ltd.) was applied to thickness of 3 μm on the transparent substrate 1 by a spin coater, pre-baked, exposed, post-exposure baked and developed to form an cathode separator 8 with an inverse-trapezoidal cross section with a pattern corresponding to backside electrodes 5.

Three transparent substrates 1 were heated 10 minutes at 200° C., 250° C. and 300° C., respectively, on a hot plate, and cooled in a chamber filled with dry nitrogen. After the substrate 1 was sufficiently cooled, it was quickly transferred to a vacuum chamber.

In the vacuum chamber, an organic luminous layer 4 of TPD/Alq$_3$ was deposited on each transparent substrate 1, and then backside electrodes 5 in a striped state extending along a direction crossing the transparent electrodes 2 with a right angle were formed thereon by vapor deposition of an Al layer. Thereafter, each EL display panel was sealed between glass sheets with an epoxy resin. The display panel had pixels of the 256×64 dots which emitted green light.

Each display panel was examined by the same test as Example 1. Test results proved that any EL display panel was stable without growth of dark spots from an edge of the insulating layer 7.

COMPARATIVE EXAMPLE

Three EL display panels each comprising pixels of 256× 64 dots for emission of green light were fabricated in the same way as Example 1 without baking treatment in prior to vapor deposition of an organic luminous layer 4 and backside electrodes 5. Each panel was examined by the same test as Example 1. Significant growth of a dark spot from an edge of an insulating layer 7 was detected in any EL display panel, and a reproduced image was extremely degraded.

It is apparently recognized from the comparison that an insulating layer 7 good of electric resistance and free from water or a solvent, which would put harmful influences on an organic luminous layer 4, is formed by baking a photoresist layer shaped to a predetermined pattern.

The organic EL display panel proposed by the present invention has an insulating layer for inhibiting short circuits between transparent electrodes and backside electrodes without harmful influences on a hole-transporting layer or an organic luminous layer. The insulating layer is converted from a photoresist layer, which is shaped to a predetermined grate pattern, by baking the photoresist layer to remove water and a solvent. Due to the insulating layer, the EL display panel is prevented from growth of dark spots from an edge of the insulating layer over a long term, and well performs for reproduction of a distinct image, as compared with a conventional EL display panel having an insulating layer made of a stable polymer such as polyimide or an inorganic substance such as metal oxide.

What is claimed is:

1. An organic electroluminescent display panel comprising:

transparent electrodes with a striped pattern laid on a transparent substrate, an insulating layer with a grate pattern, which converted from a photoresist by baking treatment, laid on said transparent electrode, optionally with a cathode separator formed thereon, an organic luminous layer deposited on said transparent electrodes through apertures of said insulating layer, and backside electrodes, which has a striped pattern extending along a direction crossing said transparent electrodes, laid on said organic luminous layer.

2. The organic electroluminescent display panel according to claim 1, wherein the photoresist is a positive novolac, negative cyclized rubber or chemical amplified photoresist.

3. The organic electroluminescent display panel according to claim 1, wherein the photoresist contains black pigment or dye.

* * * * *

UNITED STATES PATENT AND TRADEMARK OFFICE
CERTIFICATE OF CORRECTION

PATENT NO.  : 6,624,567 B2
DATED       : September 23, 2003
INVENTOR(S) : Kenichi Nagayama et al.

It is certified that error appears in the above-identified patent and that said Letters Patent is hereby corrected as shown below:

Column 1,
Line 5, "BACKGROUND" should read -- FIELD --.
After line 9, insert -- BACKGROUND OF THE INVENTION --.

Column 2,
After line 44, insert -- DETAILED DESCRIPTION OF THE PREFERRED EMBODIMENT --.

Signed and Sealed this

Twentieth Day of January, 2004

JON W. DUDAS
*Acting Director of the United States Patent and Trademark Office*